US012232271B2

(12) United States Patent
Brewel et al.

(10) Patent No.: US 12,232,271 B2
(45) Date of Patent: *Feb. 18, 2025

(54) COMPONENT PLACEMENT SYSTEMS AND METHODS OF OPERATING THE SAME

(71) Applicant: Assembléon B.V., Eindhoven (NL)

(72) Inventors: Roy Brewel, Liempde (NL); Rudolphus Hendrikus Hoefs, Eindhoven (NL); Wilhelmus Gijsbertus Leonardus Van Sprang, Eindhoven (NL)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/107,702

(22) Filed: Feb. 9, 2023

(65) Prior Publication Data
US 2023/0189493 A1 Jun. 15, 2023

Related U.S. Application Data

(63) Continuation of application No. 17/541,954, filed on Dec. 3, 2021, now Pat. No. 11,612,089.

(51) Int. Cl.
*H05K 13/04* (2006.01)
(52) U.S. Cl.
CPC .................................... *H05K 13/04* (2013.01)
(58) Field of Classification Search
CPC ............... H05K 13/04; H05K 13/0404; H05K 13/0406; H05K 13/0408; H05K 13/0409; H05K 13/041; H05K 13/0411; H05K 13/0413; Y10T 29/4913; Y10T 29/49133; Y10T 29/53174; Y10T 29/53178; Y10T 29/53183; Y10T 29/53191
See application file for complete search history.

(56) References Cited

U.S. PATENT DOCUMENTS

| 5,862,586 | A | 1/1999 | Kimura | |
|---|---|---|---|---|
| 6,154,954 | A * | 12/2000 | Seto | H05K 13/0409 414/737 |
| 6,842,974 | B1 * | 1/2005 | Maenishi | H05K 13/0478 29/840 |
| 7,716,822 | B2 * | 5/2010 | Smeets | H05K 13/0413 29/840 |
| 8,091,216 | B2 * | 1/2012 | Saho | H05K 13/0411 29/832 |

(Continued)

FOREIGN PATENT DOCUMENTS

WO WO2005013665 A1 2/2005

*Primary Examiner* — Aneeta Yodichkas
*Assistant Examiner* — Joshua D Anderson
(74) *Attorney, Agent, or Firm* — Christopher M. Spletzer, Sr.

(57) ABSTRACT

A component placement system is provided. The component placement system includes: a first bond head array configured for simultaneously carrying a first plurality of electronic components; a second bond head array configured for simultaneously carrying a second plurality of electronic components; a first motion system for simultaneously carrying the first bond head array and the second bond head array along a first motion axis; and a second motion system for carrying the first bond head array independent of the second bond head array.

12 Claims, 8 Drawing Sheets

(56) References Cited

U.S. PATENT DOCUMENTS

| | | | |
|---|---|---|---|
| 8,505,194 B2* | 8/2013 | Ban | H05K 13/041 |
| | | | 29/739 |
| 11,069,555 B2* | 7/2021 | Brewel | H01L 21/6836 |
| 2004/0139602 A1 | 7/2004 | Saho | |
| 2006/0112545 A1 | 6/2006 | Hwang | |
| 2006/0162155 A1 | 7/2006 | Van Gastel | |

* cited by examiner

COMPONENT PLACEMENT SYSTEMS AND METHODS OF OPERATING THE SAME

CROSS-REFERENCE TO RELATED APPLICATION

This application is a continuation application of U.S. patent application Ser. No. 17/541,954 filed on Dec. 3, 2021, which claims the benefit of U.S. Provisional Application No. 63/122,200, filed Dec. 7, 2020, the content of both of which is incorporated herein by reference.

FIELD

The invention relates to component placement systems for placing electronic components, and in particular, to improved component placement systems for placing multiple electronic components, and methods of operating the same.

BACKGROUND

In the electronics assembly industry, pick and place systems (i.e., component placement systems) are used for the placement of electronic components. In certain placement systems, a plurality of tools (e.g., pick up tools, pipettes, nozzles, etc.) may be carried by a single bond head array. Thus, a plurality of electronic components (each carried by a distinct tool) may be carried at the same time by the bond head array.

Often, multiple bond head arrays are included on a single placement system. Such placement systems suffer from a number of deficiencies, for example: high costs of parts; complex motion systems for each bond head array; complex movement paths; throughput inefficiencies; etc.

Thus, it would be desirable to provide improved component placement systems that overcome one or more of the deficiencies of conventional placement systems.

SUMMARY

According to an exemplary embodiment of the invention, a component placement system is provided. The component placement system includes: a first bond head array configured for simultaneously carrying a first plurality of electronic components; a second bond head array configured for simultaneously carrying a second plurality of electronic components; a first motion system for simultaneously carrying the first bond head array and the second bond head array along a first motion axis; and a second motion system for carrying the first bond head array independent of the second bond head array.

According to another exemplary embodiment of the invention, a method of operating a component placement system is provided. The method includes the steps of: (a) carrying a first plurality of electronic components using a first bond head array; (b) carrying a second plurality of electronic components using a second bond head array; (c) moving the first bond head array and the second bond head array along a first motion axis simultaneously using a first motion system; and (d) moving the first bond head array independent of the second bond head array using a second motion system. As will be appreciated by those skilled in the art, such a method may include additional steps (e.g., using the component placement systems recited in connection with any of the examples shown and described herein, or otherwise within the scope of the invention).

According to yet another exemplary embodiment of the invention, another component placement system is provided. The component placement system includes: a first support structure carrying a plurality of linear motion systems, each of the linear motion systems being configured to move one of a plurality of pick up tools; a second support structure for carrying the first support structure; and a rotative motion system for moving the first support structure with respect to the second support structure about a rotative motion axis.

According to yet another exemplary embodiment of the invention, another method of operating a component placement system is provided. The method includes the steps of: (a) carrying a plurality of linear motion systems using a first support structure, each of the plurality of linear motion systems being configured to move one of a plurality of pick up tools configured for carrying an electronic component; (b) carrying the first support structure with a second support structure; and (c) moving the first support structure with respect to the second support structure about a rotative motion axis using a rotative motion system.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

As used herein, a "bond head array" refers to a bond head configured for carrying a plurality of pick tools (e.g., pick and place tools, such as pipettes, grippers, etc.) in connection with placement operations.

In accordance with the invention, various exemplary "motion systems" are described herein. The term "motion system", as used herein (including in the claims), may refer to a single motion system (e.g., a single motion system as illustrated and described in connection with the drawings) or to a plurality of motion systems. For example, referring to FIG. 1, a y-axis motion system 104 and two x-axis motion systems 108 are described. Collectively, these three motion systems (i.e., the y-axis motion system 104 and the two x-axis motion systems 108) move the bond head arrays 106a, 106b along the y-axis and the x-axis. Thus, collectively, these three motion systems (i.e., the y-axis motion system 104 and the two x-axis motion systems 108) may be considered a single motion system within the scope of the invention. Accordingly, any single motion system or any group of motion systems described herein may be considered a "motion system" within the scope of the invention.

In accordance with various exemplary embodiments of the invention, component placement systems/devices are provided that pick and/or place electronic components simultaneously. Such component placement systems may include two (or more) bond head arrays residing on a single long stroke actuator (e.g., a long stroke y-axis actuator, a long stroke x-axis actuator, or both). The bond head arrays can be positioned independently from each other enabling parallel picking and/or parallel placement.

In accordance with the scope and spirit of the invention, many different variations are contemplated. Exemplary variations include: (a) one long stroke y-axis manipulator (e.g., see y-axis motion system 204 in FIG. 2), with two bond head arrays which can be positioned independently from one another in an XY-plane using long stroke x-axis actuators (e.g., see x-axis motion systems 208a, 208b) and a short stroke y-axis actuator (e.g., see y-axis motion system 220) (e.g., see FIG. 2); (b) one long stroke XY manipulator (e.g., where such a manipulator may include motion systems 304 and 308a in FIG. 3), one bond head (e.g., where such a bond head may include bond head arrays 306a, 306b in FIG. 3) containing two arrays that can be positioned independently in an XY-plane using two short stroke linear actuators (e.g., see FIG. 3); (c) one long stroke XY manipulator (e.g., where such a manipulator may include motion systems 404 and 408a in FIG. 4), one bond head (e.g., where such a bond head may include bond head arrays 406a, 406b in FIG. 4) containing two arrays that can be positioned independently in an XY-plane via two short stroke linear actuators, where the combination of the two arrays can be rotated, where by rotating the arrays 180 degrees the order of the arrays can be swapped (e.g., the pipettes on the right move to the left and vice versa) (e.g., see FIG. 4); (d) one long stroke XY manipulator (e.g., where such a manipulator may include motion systems 504 and 508a in FIG. 5), one bond head (e.g., where such a bond head may include bond head arrays 506a, 506b in FIG. 5) containing two arrays that can be positioned independently in an XY-plane using a single short stroke linear actuator and a rotational actuator, where by rotating the arrays another 180 degrees, the order of the arrays can be swapped (e.g., the pick up tools (e.g., pipettes) on the right move to the left and vice versa) (e.g., see FIG. 5); and (e) one long stroke XY manipulator (e.g., where such a manipulator may include motion systems 604 and 608a in FIG. 6), one bond head (e.g., where support structure 622 may be considered such a bond head) containing three pick up tools (e.g., pipettes) that can be positioned independently in an XY-plane via three short stroke actuators combined with a rotational actuator, where by choosing the right positioning of the linear actuators combined with the rotation angle, the three pick up tools (e.g., pipettes) can be arranged in any order (e.g., see FIG. 6). Of course, other variations within the scope of the invention are contemplated.

In accordance with certain exemplary embodiments of the invention, a reduced number of long stroke axes are utilized in a component placement system. In a specific example, for a second bond head the long stroke axis is replaced by a short stroke axis reducing COGS (i.e., cost of goods sold). The short stroke axis enables the second bond head to be positioned independently of the first (e.g., main) bond head. In such an example, there is only one (e.g., long stroke) manipulator, with the additional degrees of freedom supplied by the short stroke axis/axes.

Figure 1:
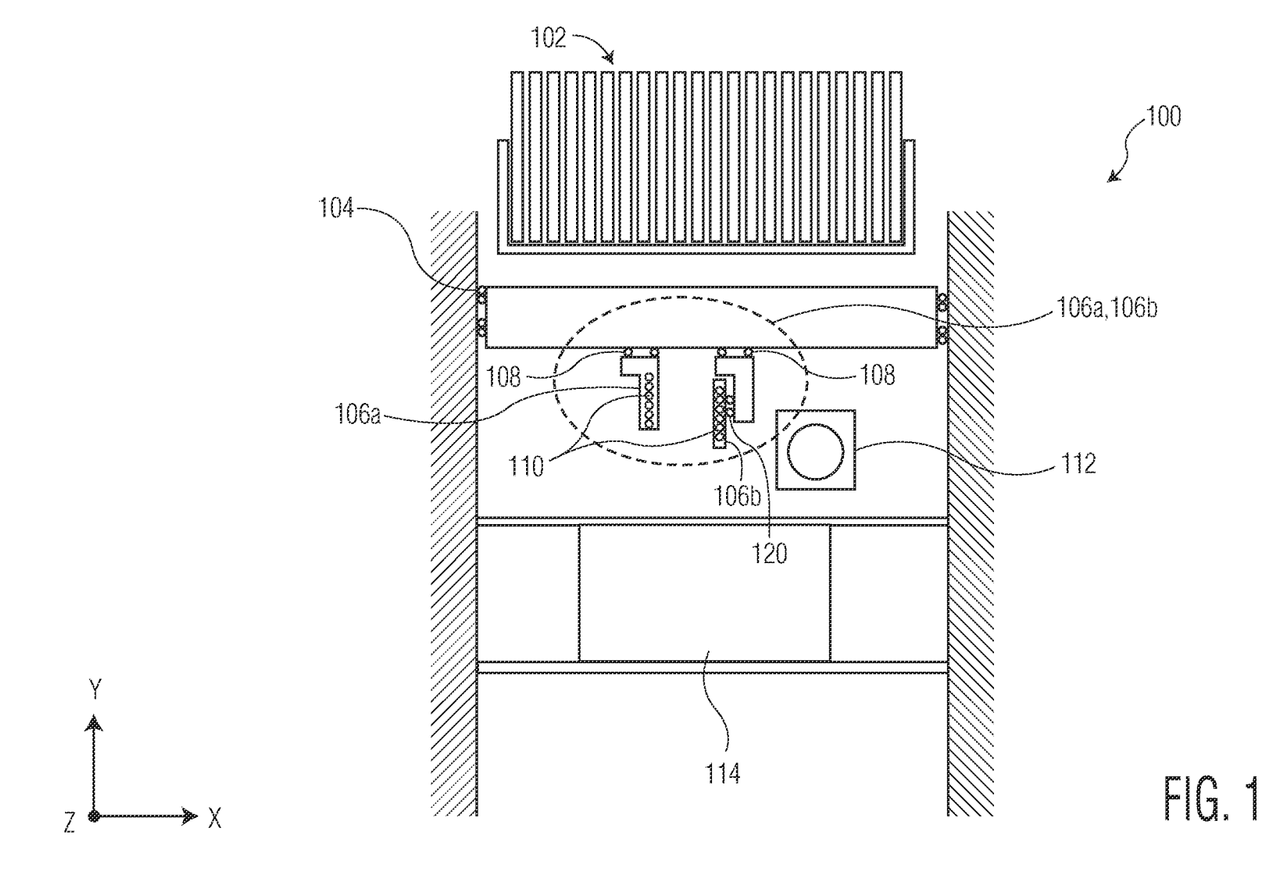
FIG. 1 is a block diagram top view of a component placement system in accordance with an exemplary embodiment of the invention.

Referring now to the drawings, FIG. 1 illustrates a component placement system 100. Component placement system 100 includes feeding area 102 for supplying various electronic components to be picked and placed onto substrate 114 (of course, multiple substrates 114 may be provided to receive electronic components). A look-up camera 112 (or other vision system element) is provided for alignment, inspection, etc. Exemplary bond head arrays 106a, 106b are illustrated in FIG. 1, each including a plurality of pick up tools 110 (e.g., pick and place tools, such as pipettes, grippers, etc.). A y-axis motion system 104 is provided to move each of bond head arrays 106a, 106b simultaneously along the y-axis of component placement system 100. A separate x-axis motion system 108 is provided for each of bond head arrays 106a, 106b—to move them separate from one another along the x-axis of component placement system 100. An additional y-axis motion system 120 is illustrated for bond head array 106b for moving its pick up tools 110 along the y-axis of component placement system 100 without bond head array 106a.

The details of bond head arrays 106a, 106b (and their associated support structures, pick up tools, and motion systems) are exemplary in nature. It is understood that any of the configurations illustrated in FIG. 2-6, or any other configuration within the scope of the invention, may be implemented in a component placement system including elements such as those illustrated in FIG. 1 (including feeding area 102, substrate 114, look-up camera 112, etc.).

Figure 2:
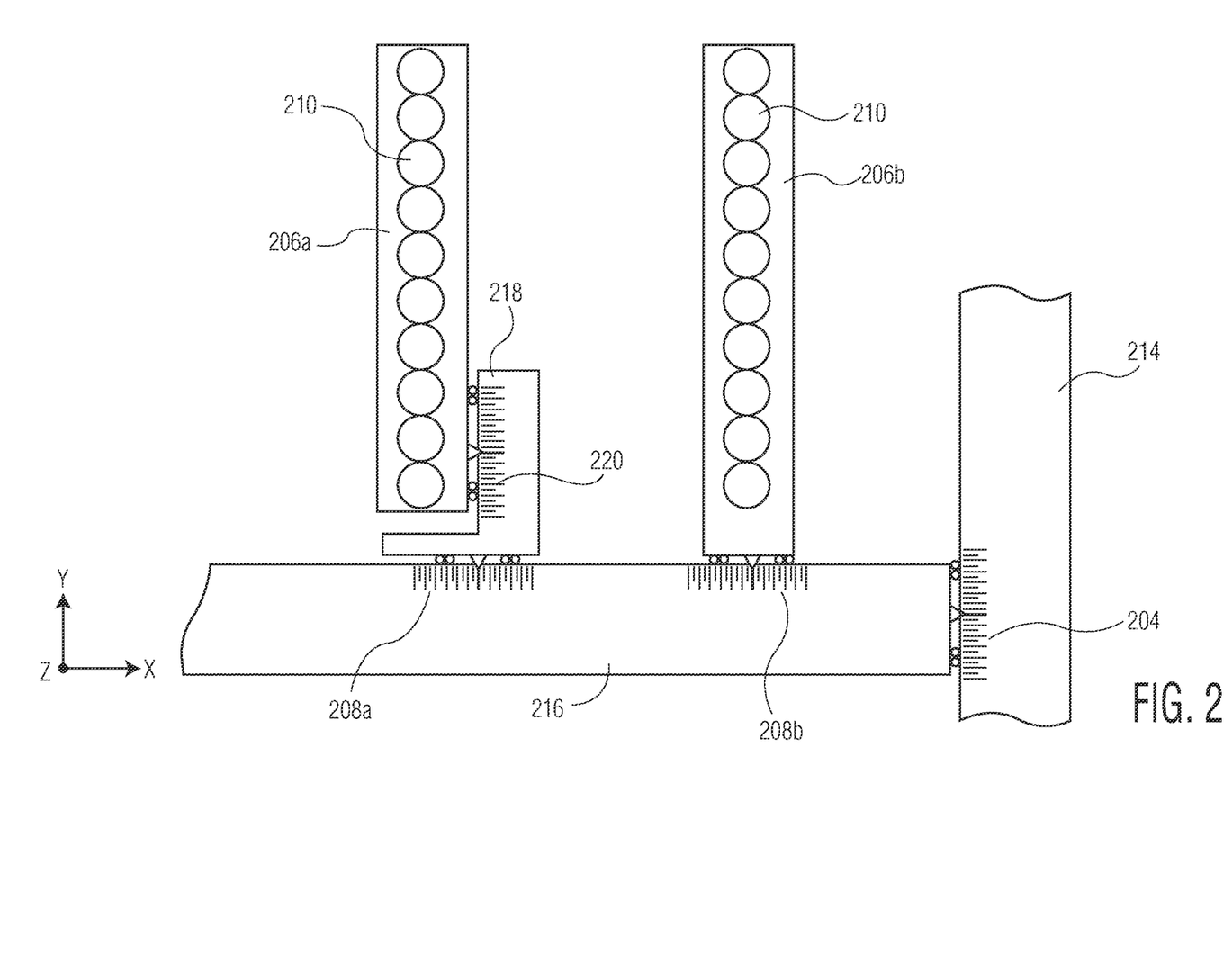
FIG. 2 is a block diagram top view of elements of a component placement system in accordance with an exemplary embodiment of the invention.

Referring now to FIG. 2, bond head arrays 206a and 206b are illustrated. A support structure 216 carries each of bond head arrays 206a, 206b. Further, another support structure 214 carries support structure 216 (and hence each of bond head arrays 206a, 206b). More specifically, support structure 216 (and hence each of bond head arrays 206a, 206b) can be moved along the y-axis of the component placement system using a y-axis motion system 204 (e.g., a long stroke actuator). Bond head array 206a is carried by an x-axis motion system 208a (via a support structure 218), thereby being moveable along the x-axis of the component placement system. Likewise, bond head array 206b is carried by an x-axis motion system 208b, thereby also being moveable along the x-axis of the component placement system. Bond head array 206a is also moveable along the y-axis of the component placement system using a y-axis motion system 220 (e.g., a short stroke actuator). Each of bond head arrays 206a, 206b includes a plurality of pick up tools 210 (e.g., pick and place tools, such as pipettes).

Thus, in summary, FIG. 2 illustrates a single long stroke y-axis motion system 204 for carrying the two bond head arrays 206a, 206b. Each of bond head arrays 206a, 206b can be moved independently along the x-axis using respective x-axis motion systems 208a, 208b (e.g., linear actuators). Finally, bond head array 206a can be moved along the y-axis using y-axis motion system 220.

Figure 3:
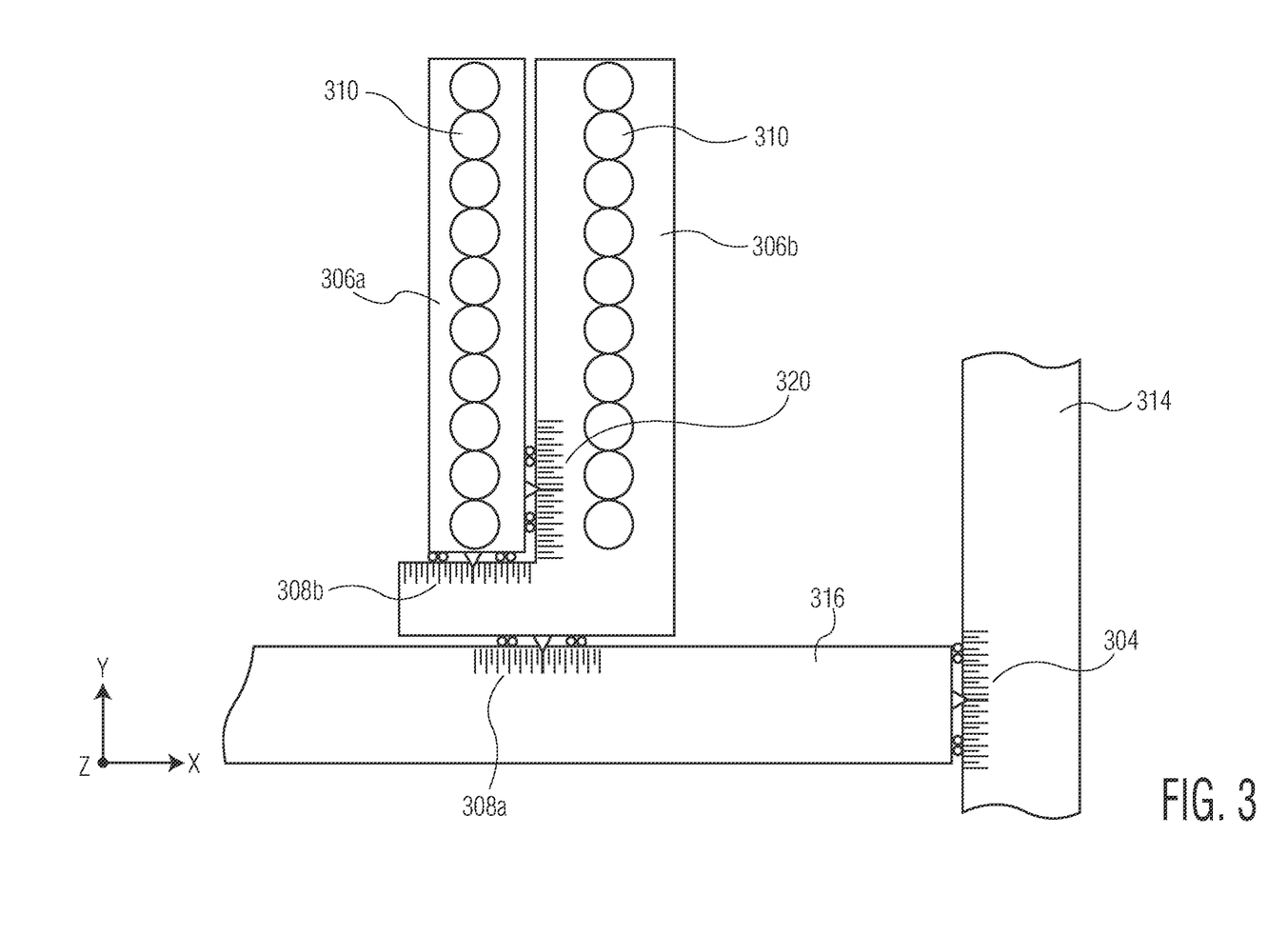
FIG. 3 is a block diagram top view of elements of another component placement system in accordance with another exemplary embodiment of the invention.

Referring now to FIG. 3, bond head arrays 306a and 306b are illustrated. A support structure 316 carries each of bond head arrays 306a, 306b. Further, another support structure 314 carries support structure 316 (and hence each of bond head arrays 306a, 306b). More specifically, support structure 316 (and hence each of bond head arrays 306a, 306b) can be moved along the y-axis of the component placement system using a y-axis motion system 304 (e.g., a long stroke actuator). Bond head array 306a and bond head array 306b are both carried by an x-axis motion system 308a (e.g., a long stroke actuator), thereby being moveable along the x-axis of the component placement system. Bond head array 306a is also moveable along the each of the x-axis and the y-axis of the component placement system independently of bond head array 306b (although 306a of FIG. 3 is illustrated supported/constrained by roller bearings in both X and Y directions (thus restricting travel) for simplicity, it is understood that an additional support structure separating the directions could be used). More specifically, bond head array 306a may be moved along the x-axis, independently of bond head array 306b, using an x-axis motion system 308b (e.g., a short stroke actuator). Further, bond head array 306a may be moved along the y-axis, independently of bond head array 306b, using a y-axis motion system 320 (e.g., a short stroke actuator). Each of bond head arrays 306a, 306b includes a plurality of pick up tools 310 (e.g., pick and place tools, such as pipettes, grippers, etc.).

Thus, in summary, FIG. 3 illustrates (i) a single long stroke y-axis motion system 304 for carrying the two bond head arrays 306a, 306b; and (ii) a single long stroke x-axis motion system 308a for carrying the two bond head arrays 306a, 306b. Further, bond head array 306a can be moved independently from bond head array 306b along the x-axis using x-axis motion system 308b, and along the y-axis using y-axis motion system 320.

Figure 4:
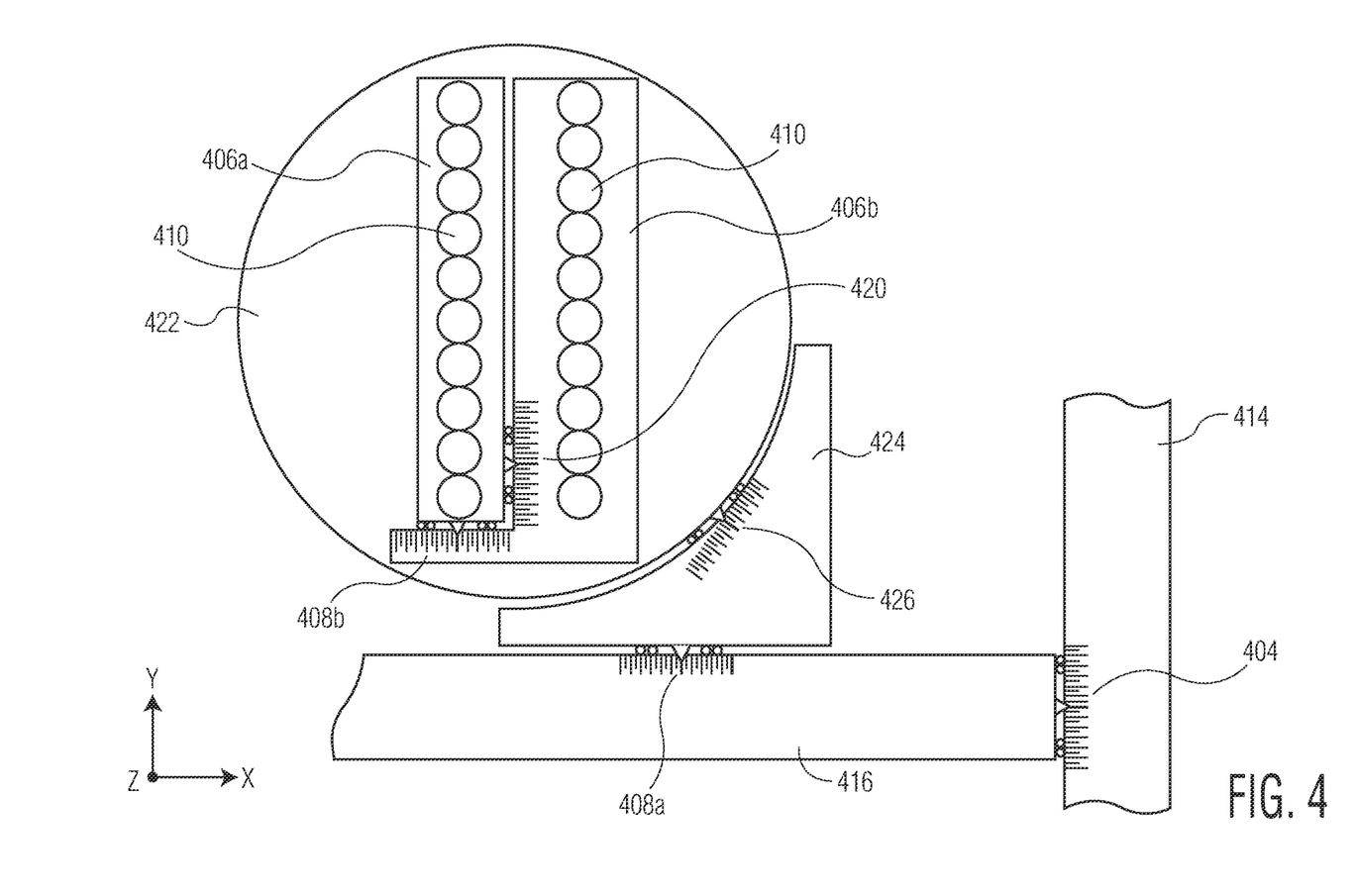
FIG. 4 is a block diagram top view of elements of yet another component placement system in accordance with yet another exemplary embodiment of the invention.

Referring now to FIG. 4, bond head arrays 406a and 406b are illustrated. A support structure 416 carries each of bond head arrays 406a, 406b. Further, another support structure 414 carries support structure 416 (and hence each of bond head arrays 406a, 406b). More specifically, support structure 416 (and hence each of bond head arrays 406a, 406b) can be moved along the y-axis of the component placement system using a y-axis motion system 404 (e.g., a long stroke actuator). Bond head array 406a and bond head array 406b are both carried by an x-axis motion system 408a (e.g., a long stroke actuator) (via a support structure 424), thereby being moveable along the x-axis of the component placement system. Bond head array 406a and bond head array 406b are also both carried by a rotative motion system 426 (via a support structure 422), and thus bond head array 406a and bond head array 406b are simultaneously carried about a rotative motion axis (i.e., carried about the z-axis). For example, by rotating 180 degrees, the order of the arrays can be swapped (e.g., the bond head array on the right moves to the left and vice versa).

Bond head array 406a is also moveable along the each of the x-axis and the y-axis of the component placement system independently of bond head array 406b (although 406a of FIG. 4 is illustrated supported/constrained by roller bearings in both X and Y directions (thus restricting travel) for simplicity, it is understood that an additional support structure separating the directions could be used). More specifically, bond head array 406a may be moved along the x-axis, independently of bond head array 406b, using an x-axis motion system 408b (e.g., a short stroke actuator). Further, bond head array 406a may be moved along the y-axis, independently of bond head array 406b, using a y-axis motion system 420 (e.g., a short stroke actuator). Each of bond head arrays 406a, 406b includes a plurality of pick up tools 410 (e.g., pick and place tools, such as pipettes, grippers, etc.).

Thus, in summary, FIG. 4 illustrates (i) a single long stroke y-axis motion system 404 for carrying the two bond head arrays 406a, 406b; (ii) a single long stroke x-axis motion system 408a for carrying the two bond head arrays 406a, 406b; and (iii) a single rotative motion system 426 for carrying bond head array 406a and bond head array 406b about a rotative motion axis. Further, bond head array 406a can be moved independently from bond head array 406b along the x-axis using x-axis motion system 408b, and along the y-axis using y-axis motion system 420.

Figure 5:
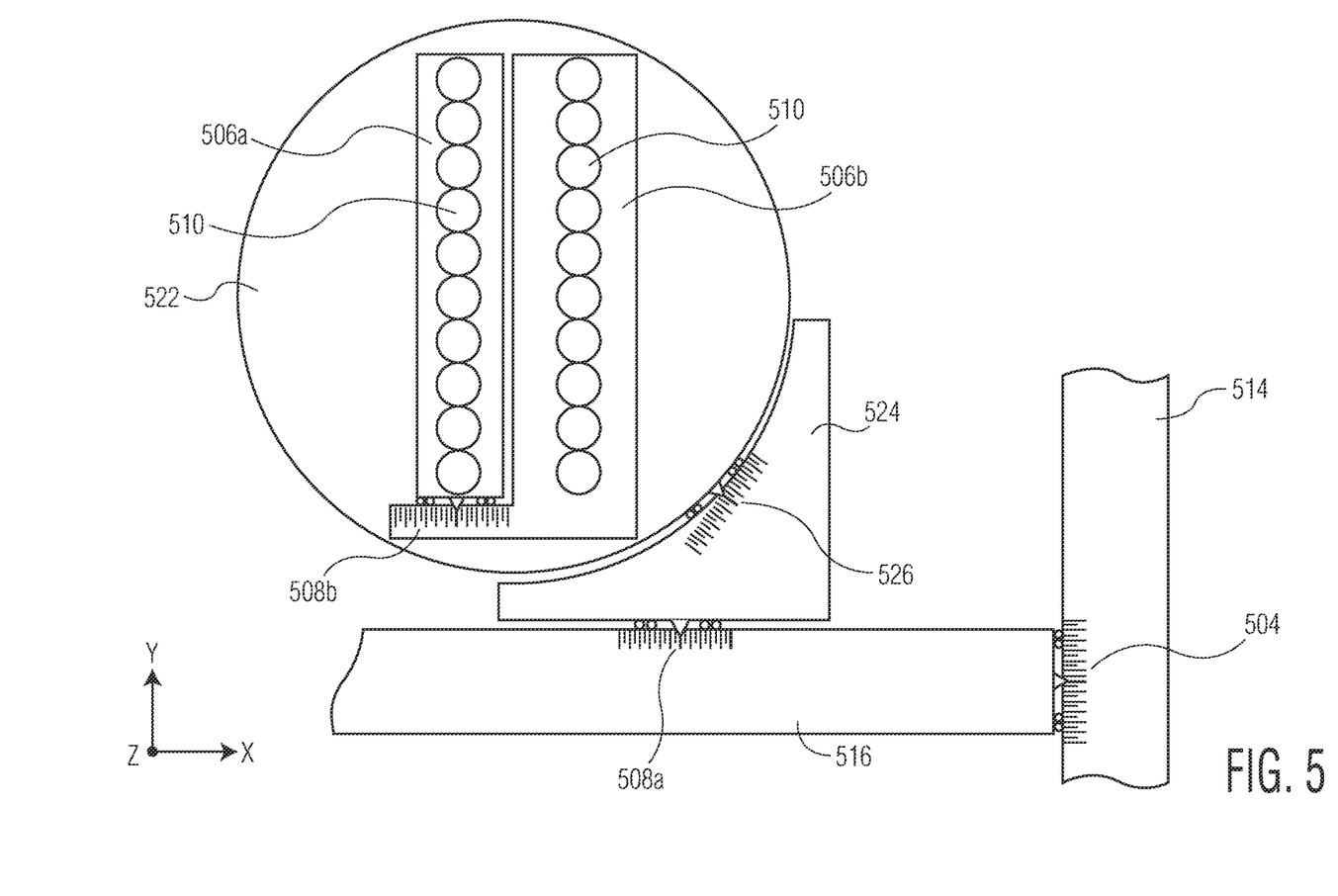
FIG. 5 is a block diagram top view of elements of yet another component placement system in accordance with yet another exemplary embodiment of the invention.

Referring now to FIG. 5, bond head arrays 506a and 506b are illustrated. A support structure 516 carries each of bond head arrays 506a, 506b. Further, another support structure 514 carries support structure 516 (and hence each of bond head arrays 506a, 506b). More specifically, support structure 516 (and hence each of bond head arrays 506a, 506b) can be moved along the y-axis of the component placement system using a y-axis motion system 504 (e.g., a long stroke actuator). Bond head array 506a and bond head array 506b are both carried by an x-axis motion system 508a (e.g., a long stroke actuator) (via a support structure 524), thereby being moveable along the x-axis of the component placement system. Bond head array 506a and bond head array 506b are also both carried by a rotative motion system 526 (via a support structure 522), and thus bond head array 506a and bond head array 506b are simultaneously carried about a rotative motion axis (i.e., carried about the z-axis). For example, by rotating 180 degrees, the order of the arrays can be swapped (e.g., the bond head array on the right moves to the left and vice versa).

Bond head array 506a is also moveable along the x-axis of the component placement system independently of bond head array 506b. More specifically, bond head array 506a may be moved along the x-axis, independently of bond head array 506b, using an x-axis motion system 508b (e.g., a short stroke actuator). Each of bond head arrays 506a, 506b includes a plurality of pick up tools 510 (e.g., pick and place tools, such as pipettes, grippers, etc.).

Thus, in summary, FIG. 5 illustrates (i) a single y-axis motion system 504 (e.g., a long stroke motion system) for carrying the two bond head arrays 506a, 506b; (ii) a single x-axis motion system 508a (e.g., a long stroke motion system) for carrying the two bond head arrays 506a, 506b; and (iii) a single rotative motion system 526 for carrying bond head array 506a and bond head array 506b about a rotative motion axis. Further, bond head array 506a can be moved independently from bond head array 506b along the x-axis using x-axis motion system 508b.

Figure 6:
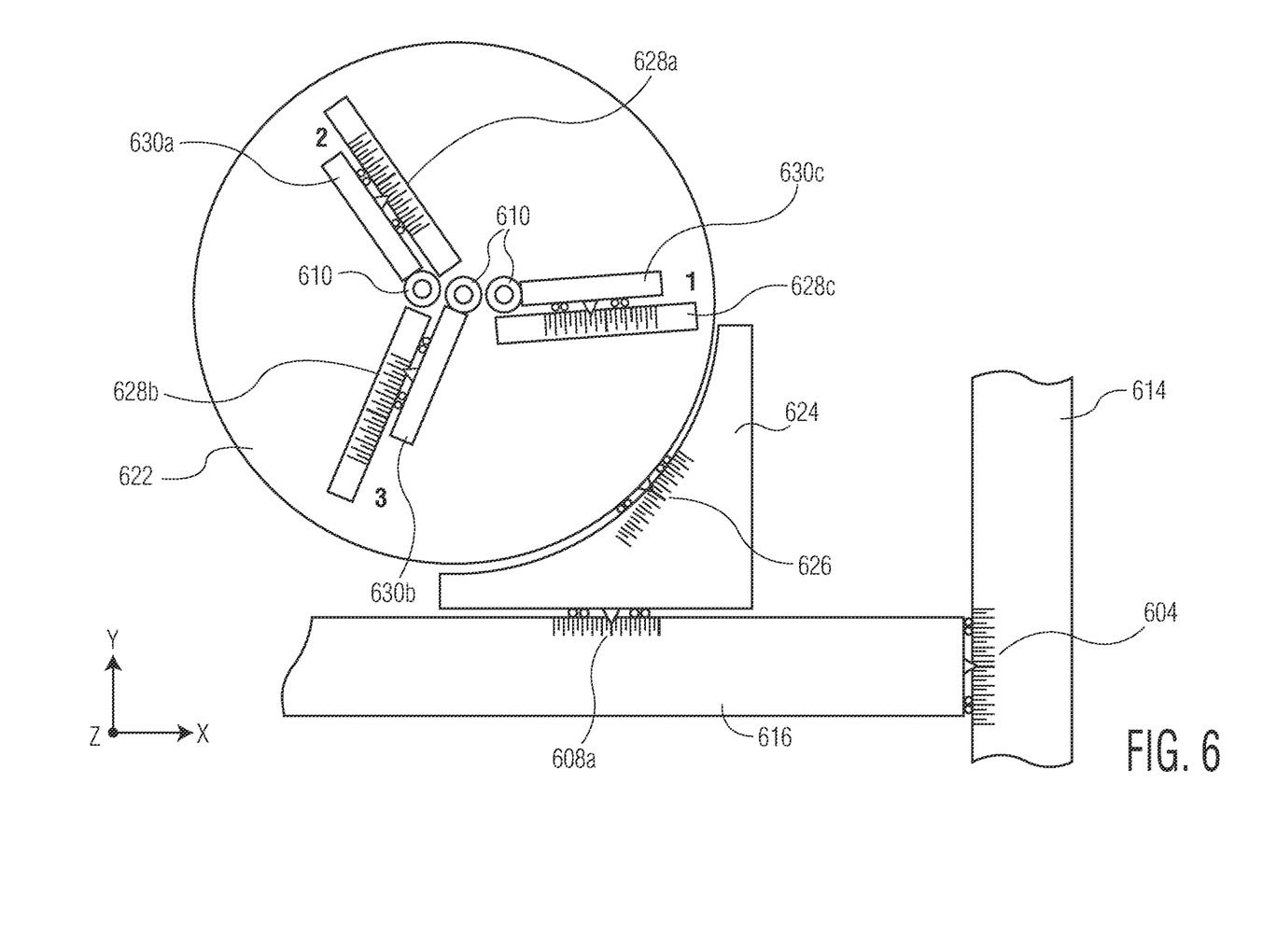
FIG. 6 is a block diagram top view of elements of yet another component placement system in accordance with yet another exemplary embodiment of the invention.

Referring now to the overhead view of FIG. 6, three distinct pick up tools 610 are illustrated, each being carried by a respective one of support structures 630a, 630b, and 630c. Each of linear motion systems 628a, 628b, and 628c are provided to move a respective one of support structures 630a, 630b, and 630c (and hence, the respective pick up tool 610) with respect to a support structure 622 (where support structure 622 may be considered a bond head).

As detailed below, a support structure 616 carries support structure 622 via a linear motion system 608a (e.g., an x-axis motion system), a support structure 624, and a rotative motion system 626. Further, another support structure 614 carries support structure 616. More specifically, support structure 616 (and hence each of pick up tools 610) can be moved along the y-axis of the component placement system using a linear motion system 604 (e.g., a long stroke actuator, a y-axis motion system, etc.). Each of the three pick up tools 610 are carried by linear motion system 608a (e.g., a long stroke actuator, an x-axis motion system, etc.) (via support structure 624), thereby being moveable along the x-axis of the component placement system. Each of the three pick up tools are also both carried by rotative motion system 626 (via support structure 622), and thus are simultaneously carried about a rotative motion axis (i.e., carried about the z-axis).

Thus, in summary, FIG. 6 illustrates (i) a single linear motion system 604 (e.g., a long stroke motion system, a y-axis motion system, etc.) for carrying the three pick up tools 610; (ii) a single linear motion system 608a (e.g., a long stroke motion system, an x-axis motion system, etc.) for carrying the three pick up tools 610; and (iii) a single rotative motion system 626 for carrying the three pick up tools 610 about a rotative motion axis. Further, each of the three pick up tols 610 can be moved independently along a respective linear axis using respective linear motion system 628a, 628b, and 628c (e.g., short stroke linear actuators). By choosing the right positioning of the linear motion systems 628a, 628b, and 628c with a desired rotation angle of rotative motion system 626, the three pick up tools 610 (e.g., pipettes, grippers, etc.) can be arranged in any desired configuration.

Figure 7:
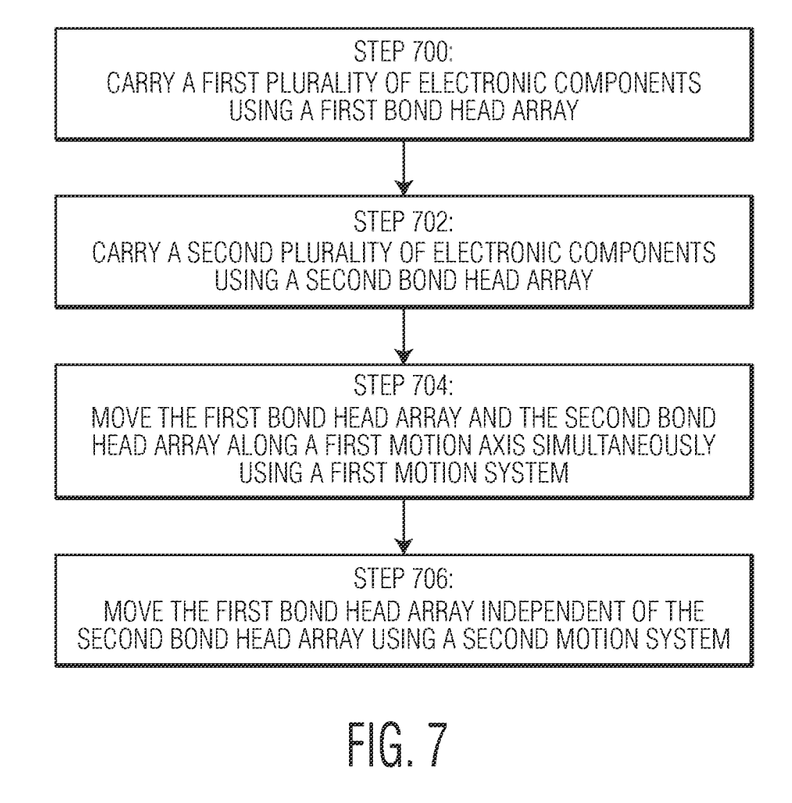
FIGS. 7-8 are flow diagrams illustrating methods of operating component placement systems in accordance with various exemplary embodiments of the invention.
Figure 8:
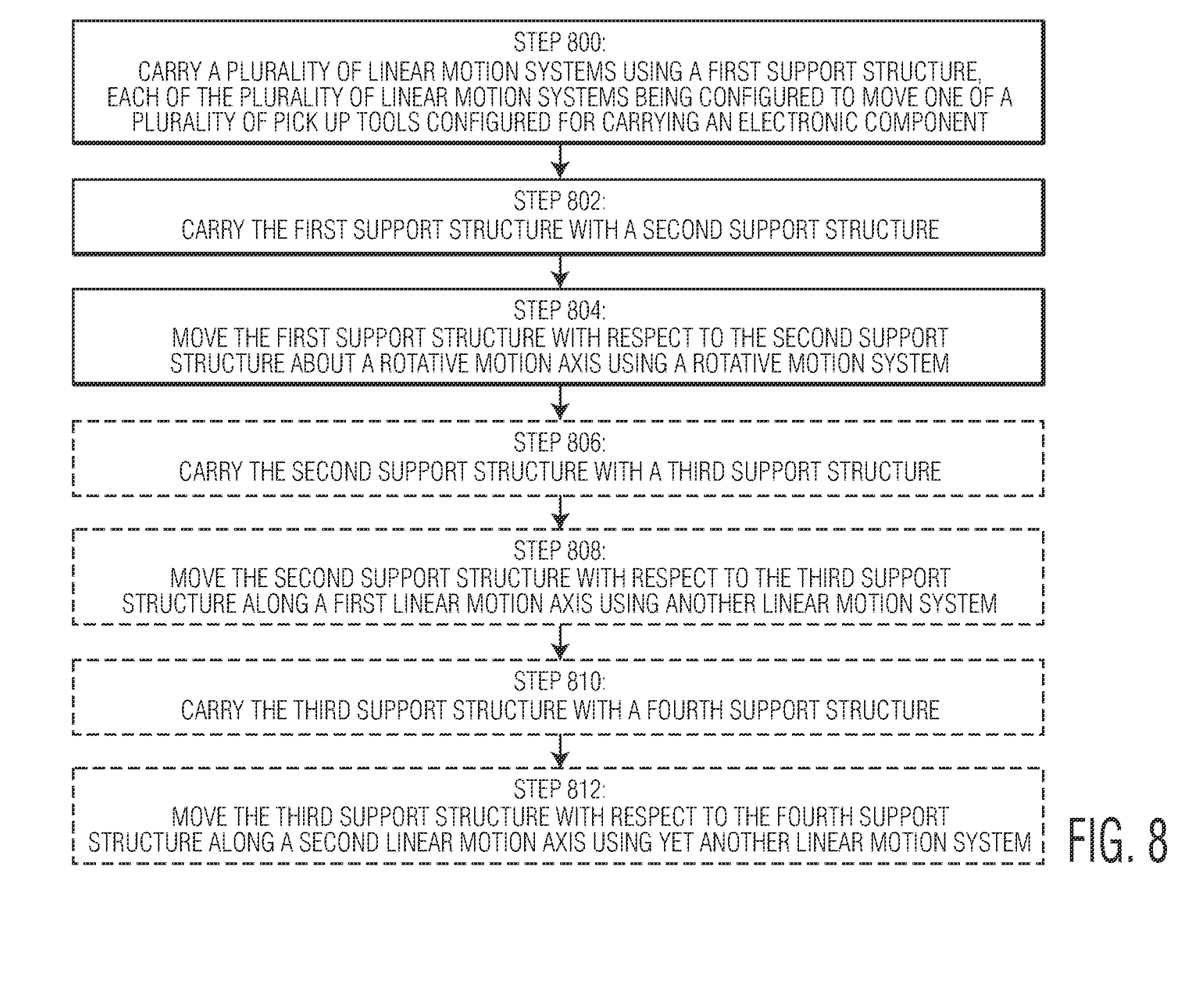

FIGS. 7-8 are flow diagrams illustrating methods of operating a component placement system. As is understood by those skilled in the art, certain steps included in the flow diagrams may be omitted; certain additional steps may be added; and the order of the steps may be altered from the order illustrated-all within the scope of the invention.

Referring now to FIG. 7, in Step 700, a first plurality of electronic components are carried using a first bond head array. In Step 702, a second plurality of electronic components is carried using a second bond head array. In Step 704, the first bond head array and the second bond head array are moved along a first motion axis simultaneously using a first motion system (e.g., bond head arrays 106a, 106b are moved along the y-axis using motion system 104; bond head arrays 106a, 106b are moved along the x-axis using a motion system including the two x-axis motion systems 108) (e.g., bond head arrays 206a, 206b are moved along the y-axis using y-axis motion system 204; bond head arrays 206a, 206b are moved along the x-axis using a motion system including the two x-axis motion systems 208a, 208b). Step 706, the first bond head array is moved independent of the second bond head array using a second motion system (e.g., bond head array 106b is moved independent of bond head array 106a using y-axis motion system 120) (e.g., bond head array 206a is moved independent of bond head array 206b using y-axis motion system 220).

Referring now to FIG. 8, in Step 800, a plurality of linear motion systems are carried using a first support structure, each of the plurality of linear motion systems being configured to move one of a plurality of pick up tools configured for carrying an electronic component. In Step 802, the first support structure is carried with a second support structure. In Step 804, the first support structure is moved with respect to the second support structure about a rotative motion axis using a rotative motion system (e.g., see FIG. 6 where support structure 622 is moved with respect to support structure 624 about a rotative axis using rotative motion system 626). In optional Step 806, the second support structure is carried with a third support structure. In optional Step 808, the second support structure is moved with respect to the third support structure along a first linear motion axis using another linear motion system (e.g., see FIG. 6 where support structure 624 is moved with respect to support structure 616 using linear motion system 608a). In optional Step 810, the third support structure is carried with a fourth support structure. In optional Step 812, the third support structure is moved with respect to the fourth support structure along a second linear motion axis using yet another linear motion system (e.g., see FIG. 6 where support structure 616 is moved with respect to support structure 614 using linear motion system 604).

As will be appreciated by those skilled in the art, the pick and place tools (e.g., pick up tools, pipettes, grippers, etc.) described herein are configured to pick and/or place any electronic component as needed in a given application. Exemplary electronic components include semiconductor elements, discrete components, and any other electronic component which may be placed using the inventive component placement systems described herein.

As will be appreciated by those skilled in the art, the motion systems described herein (e.g., y-axis motion systems, x-axis motion systems, linear motion systems, rotative motion systems, etc.) are shown in a simplified form. Such motion systems may include various subcomponents, and may be considered to be manipulators, actuators, motors, or any other type of motion system applicable to the inventive component placement systems described herein.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A component placement system comprising:
    a first bond head array, including a first plurality of pick up tools, configured for simultaneously carrying a first plurality of electronic components, the first plurality of pick up tools being arranged in a linear configuration in the first bond head array;
    a second bond head array, including a second plurality of pick up tools, configured for simultaneously carrying a second plurality of electronic components, the second plurality of pick up tools being arranged in a linear configuration in the second bond head array;
    a first support structure for carrying each of the first bond head array and the second bond head array;
    a second support structure for carrying the first bond head array independent of the second bond head array;
    a first motion system for simultaneously carrying the first bond head array and the second bond head array along a first motion axis by moving the first support structure along the first motion axis, the first motion system including a long stroke actuator;
    a second motion system for carrying the first bond head array via the second support structure with respect to the first support structure along a second motion axis, the second motion system for moving the first bond head array along the second motion axis independent of the second bond head array, the second motion system including a long stroke actuator;
    a third motion system for moving the second bond head array with respect to the first support structure along the second motion axis independent of the first bond head array, the third motion system including a long stroke actuator; and
    a fourth motion system for carrying the first bond head array independent of the second bond head array along the first motion axis via the second support structure.

2. The component placement system of claim 1 wherein the first motion axis includes a linear axis of the component placement system.

3. The component placement system of claim 1 wherein the first motion axis is a y-axis of the component placement system.

4. The component placement system of claim 1 wherein the second motion system is carried by the first motion system.

5. The component placement system of claim 1 wherein the fourth motion system includes a short stroke actuator.

6. The component placement system of claim 1 wherein the first motion axis is substantially perpendicular to the second motion axis.

7. The component placement system of claim 1 wherein the first motion axis is a y-axis of the component placement system, and the second motion axis is an x axis of the component placement system.

8. The component placement system of claim 1 wherein the second motion axis is an x axis of the component placement system.

9. A method of operating a component placement system, the method comprising the steps of:
   (a) carrying a first plurality of electronic components using a first plurality of pick up tools of a first bond head array, the first plurality of pick up tools being arranged in a linear configuration in the first bond head array;
   (b) carrying a second plurality of electronic components using a second plurality of pick up tools of a second bond head array, the second plurality of pick up tools being arranged in a linear configuration in the second bond head array;
   (c) moving a first support structure using a first motion system, the first support structure simultaneously carrying the first bond head array and the second bond head array along a first motion axis simultaneously using the first motion system with a long stroke actuator of the first motion system;
   (d) moving the first bond head array with a second motion system via a second support structure with respect to the first support structure along a second motion axis, the second motion system moving the first bond head array along the second motion axis independent of the second bond head array with a long stroke actuator of the second motion system;
   (e) moving the second bond head array with respect to the first support structure along the second motion axis with a third motion system, the third motion system moving the second bond head array along the second motion axis independent of the first bond head array with a long stroke actuator of the third motion system; and
   (f) moving the first bond head array along the first motion axis with a fourth motion system, the fourth motion system moving the first bond head array independent of the second bond head array.

10. The method of claim 9 wherein step (f) includes moving the first bond head array along the first motion axis with a short stroke actuator of the fourth motion system.

11. The method of claim 9 wherein the first motion axis is a y-axis of the component placement system.

12. The method of claim 9 wherein the second motion axis is an x-axis of the component placement system.

* * * * *